United States Patent [19]
DesJardins et al.

[11] Patent Number: 6,029,186
[45] Date of Patent: Feb. 22, 2000

[54] HIGH SPEED CALCULATION OF CYCLICAL REDUNDANCY CHECK SUMS

[75] Inventors: Philip A. DesJardins, Nevada City; Ravi G. Mantri, Grass Valley, both of Calif.

[73] Assignee: 3Com Corporation, Santa Clara, Calif.

[21] Appl. No.: 09/009,069

[22] Filed: Jan. 20, 1998

[51] Int. Cl.[7] ............................................. G06F 7/00
[52] U.S. Cl. ............................................. 708/492
[58] Field of Search .................... 708/491–492; 714/758–759

[56] References Cited

U.S. PATENT DOCUMENTS

| | | | |
|---|---|---|---|
| 5,325,372 | 6/1994 | Ish-Shalom | 714/758 |
| 5,446,745 | 8/1995 | Gibbs | 708/492 |
| 5,596,589 | 1/1997 | Thomsen et al. | 371/37.8 |
| 5,642,367 | 6/1997 | Kao . | |
| 5,712,861 | 1/1998 | Inoue et al. . | |
| 5,771,244 | 6/1998 | Reed et al. . | |
| 5,822,337 | 10/1998 | Zook et al. . | |

FOREIGN PATENT DOCUMENTS

| | | |
|---|---|---|
| 0 470 451 A2 | 2/1992 | European Pat. Off. . |
| 0 609 595 A1 | 8/1994 | European Pat. Off. . |
| WO 94/15407 | 7/1994 | WIPO . |

*Primary Examiner*—Tan V. Mai
*Attorney, Agent, or Firm*—McDonnell Boehnen Hulbert & Berghoff

[57] ABSTRACT

A method and device for calculating Cyclical Redundancy Checksums (CRC) used in error-detection codes. To calculate CRCs more quickly using a computer with memory access latency, a frame of data is partitioned into a plurality of sub-frames. A look-up table containing pre-computed CRC values is stored in computer memory and accessed during the CRC calculation of the sub-frames. The CRC of the sub-frames can then be calculated and combined to form the CRC of the frame of data. To speed the calculation, CRCs of a number of the sub-frames can be calculated simultaneously.

24 Claims, 7 Drawing Sheets

HIGH SPEED CALCULATION OF CYCLICAL REDUNDANCY CHECK SUMS

BACKGROUND OF THE INVENTION

A. Field of the Invention

The present invention relates to a method and device for calculating Cyclical Redundancy Checksums using a programmable computer.

B. Description of the Related Art

Digital data transmission systems are used in a variety of different applications ranging from transferring financial numbers representing dollar amounts in bank accounts, to storing the music of our favorite performers on compact digital audio discs, to communicating telemetry data with aircraft and orbiting space satellites. To transmit this type of information, digital transmission systems deliver a sequence of binary information to a receiver across a transmission channel. Due to impairments in the transmission channel (i.e., the inability of the transmission channel to accurately deliver the transmitted bits), the binary information may become corrupted or change as it traverses the transmission channel. If undetected, the amounts in our bank accounts would be wrong, our favorite singers would be out of tune, and aircraft could be lost.

To prevent these problems, error detection schemes are employed to detect differences between the originally transmitted bits and the received data bits. To implement an error detection scheme, a bit stream is divided into a series of frames, each frame being a known grouping of bits. The frames are either of fixed length (e.g., 256 bits), or are variable length (delineated by known patterns); either way frame boundaries are recoverable by the receiver. The transmitter then appends a cyclic redundancy checksum ("CRC") to each transmitted frame. CRCs are often used because they are easy to implement and can detect a large class of errors. The mathematics underlying CRCs is known to those skilled in the art of error control coding and described in "Error Control Coding: An Introduction," by Peter Sweeney, Prentice Hall 1991, and "Theory and Practice of Error Control Codes," by Richard E. Blahut, Addison-Wesley Publishing Company, Inc., 1983, which are hereby incorporated by reference.

The transmitter determines the CRC by interpreting the bits in a frame to be the coefficients of a binary field polynomial. For example, if there are K bits in a frame then the bits in the message $c_{K-1}, c_{K-2}, c_{K-3}, \ldots c_2, c_1, c_0$, where $C_{K-1}$ is first in the frame (transmitted first in time) and $c_0$ last in the sequence (transmitted last), each have the value 1 or 0. This frame can thus be represented as a $(K-1)^{th}$ order polynomial:

$$C(X) = c_{K-1}X^{K-1} + c_{K-2}X^{K-2} + \ldots + c_2X^2 + c_1X + c_0$$

where X is a bit delay operator and the $c_i$'s are the coefficients of a binary field polynomial.

The frame is then augmented by appending R zero bits to form an augmented frame with N=K+R bits. Appending R zeros is mathematically equivalent to multiplying the polynomial by $X^R$. The augmented polynomial is now $C(X)*X^R$, an (N−1)th order polynomial.

The CRC of the frame is calculated by dividing $C(X)*X^R$ by a binary field polynomial of order R, G(X) known as the generator polynomial. The remainder of the polynomial division is another polynomial of order R−1, represented by R bits. Appending the bits to the original non-augmented frame is mathematically equivalent to adding the remainder to the augmented polynomial, forming a transmitted polynomial $$T(X) = C(X)*X^R + ((C(X)*X^R) \bmod G(X)),$$

The calculated CRC can be used to detect if errors occurred in the received data. The receiver receives the N bit frame, treats the bits as the coefficients of an $(N-1)^{th}$ order polynomial and divides this polynomial by the generator polynomial. The remainder of this division will be zero if no errors occurred during transmission.

Both the transmitter and receiver must perform polynomial division. Any apparatus or method to accelerate this division will either allow for faster data transmission or lower transmitter and receiver complexity.

Shown in FIG. 1 is a prior art circuit for dividing a frame of bits by a generator polynomial to generate a CRC. The circuitry uses shift registers with feedback to implement the division of a frame of bits by an example generator polynomial $G(X)=X^8+X^4+X^3+X^2+1$. The remainder registers $R_7$ to $R_0$ represent delays of 1 bit. The Exclusive-OR logic gates 10 before registers $R_0, R_2, R_3, R_4$ correspond to the non-zero coefficients of the G(X) divisor polynomial; the XOR operation is equivalent to subtracting the generator polynomial from the current remainder. The remainder registers $R_7$ to $R_0$ are typically initialized to the first 8 bits of the message, that is $C_{N-1}$ to $C_{N-8}$, at the start of the polynomial division. Alternatively, the remainder can be initialized to zero and the circuitry of FIG. 1 can be clocked an additional 8 times to shift the first 8 bits of the message, that is $C_{N-1}$ to $C_{N-8}$. Then, the frame bits are shifted at each iteration into the circuitry in the order $C_{N-9}, C_{N-10}, C_{N-11}, C_{N-12}, \ldots C_1, C_0$. At the end of iterations, registers $R_7$ through $R_0$ contain the final remainder, which is shifted out as the CRC (at the transmitter) or used to determine if errors occurred (at the receiver).

The bit streams comprising digital messages are commonly grouped into symbols of m-bits each. This is because usually data that are transmitted are already grouped into symbols. Typically the symbols are 8-bit, 16-bit or 32-bit long. This natural grouping motivates a method of calculating bit field polynomial division efficiently for symbol-oriented message streams. Calculating CRCs using a computer processor is particularly well suited to calculating a symbol at a time because the Arithmetic Logic Unit and data buses are capable of symbol-wide logical operations. The division operation implemented bit-wise by the circuit of FIG. 1 can be performed symbol-wise by a similar circuit shown in FIG. 1a. In this circuit the component "remainder re-circulator" is a combinatorial circuit performing the equivalent of clocking the circuit of FIG. 1 m (here m=8) times while forcing the message bits c's to zero; that is, it recirculates the remainder m (here m=8) times through the XOR/shift register circuit. The output of the symbol-wise recirculator is then XORed with the next m bits of the incoming message; this symbol-wise XOR operation is equivalent to shifting the next symbol of the message in one bit at a time for a total of m (here m=8) shifts. By inspection, the reader can determine that these two steps are equivalent to clocking the circuit of FIG. 1 m times. It is readily determined by inspection that the input $c_i$s have no bearing on the output of R7. The remainder recirculation is dependent only on the initial value of the remainder, and the later symbol-wise XOR of the recirculated remainder with the $c_i$ bits performs the equivalent of being shifted through the register m times. In a computer processor, the remainder recirculator function can be implemented in a lookup table and the symbol-wise XOR function can be implemented in the processor's ALU. The division can thus be calculated with an iterative loop containing the following steps. First, the current remainder indexes the lookup table, and then the table's output is XORed with the next incoming symbol of the frame:

CRC=CRCMOD1(CRC) XOR FRAME(i), where CRC-MOD1 is the look-up table implementing the remainder re-circulation.

Shown in FIG. 1b is a diagram of a generalized circuit for binary polynomial division. In this circuit, the CRC width is R bits, and a symbol is m bits wide. This circuit operates in three steps for each symbol. First, the m upper bits of the remainder are used as the address of a R-bit wide lookup table implementing the recirculation function. Second, the remainder is shifted left by m bits, and XORed with the table result. Thirdly, the next symbol of the message is XORed with the result of the previous step to form the new remainder. The above three steps are equivalent to calculating the R-bit remainder of $(R(X)*X^m+C(X))$ modulo $G(X)$ where $R(X)$ is the value of the symbol contained in the R-bit remainder register and $G(X)$ is the divisor.

One drawback of this method is that many computer processors require multi-cycle latencies to access a look-up table stored in memory. The result of a memory access is thus not available until several clock cycles after the memory access is initiated. Several independent memory accesses can be in the pipeline, but the result of an access can not be used, for example, as the operand of another memory access, until the first access is completed. The processor may thus wait idle until the memory operation completes. One example of such a processor is the Texas Instruments TMS320C6x family of digital signal processors, which has a 5-cycle memory access latency, although memory cycles can be initiated on every clock cycle.

Such memory latency limits the execution time of the loop calculating the remainder. The loop becomes "stalled" waiting for the look-up section of the iteration, and the processor waits idle. It would be desirable to find a method and apparatus to more efficiently calculate the remainders of binary polynomial division.

SUMMARY OF THE INVENTION

The present invention addresses the problem of calculating CRCs to detect errors in a data transmission system. The present invention reduces the amount of computation time necessary to perform the remainder calculations using a programmable computer. In particular, the present invention speeds the calculation of remainders used in CRCs using a look-up table stored in the memory of computer processors requiring a latent memory access operation to retrieve data from computer memory.

In a described embodiment, a frame of data is partitioned or split into a series of symbols; symbols are a fixed number, often but not always 8, of contiguous bits. This sequence is further partitioned into a plurality of sub-frames with a number of interleaved zero symbols. The remainders of the zero-interleaved sub-frames are calculated. To speed the calculation of the remainder, the computer processor may calculate the remainders of a number of the sub-frames simultaneously. The remainders of the sub-frames are then combined to form the CRC of the frame of data.

According to another aspect of the invention, a CRC-MODK look-up table is used to calculate CRC. In an exemplary embodiment, the CRCMODK look-up table contains pre-calculated recirculation values stored in computer memory. The CRCMODK look-up compensates the interleaved zero symbols in each sub-frame.

According to another aspect of the invention, a second look-up table is used while combining the remainders of the sub-frames to form the remainder of the frame of data. The second look-up table accounts for a number of extended zero symbols in the plurality of sub-frames. In an exemplary embodiment, CRCMOD1 is the second look-up table.

According to yet another aspect of the invention, the generation of the CRCMODK look-up table is described. Also described is the generation of the second look-up table to account for a number of extended zero symbols in the plurality of sub-frames.

According to another aspect of the invention, a device to calculate remainders is described. In an exemplary embodiment, a splitter partitions the frame of data into a plurality of zero-interleaved sub-frames. The remainder of a number of the sub-frames can be calculated simultaneously and combined to form the remainder of the frame of data.

Briefly summarized, the present invention relates to the calculation of CRCs used to error-code transmitted data. In accordance with the present invention, the remainder calculation of a frame of data or a polynomial can be split into a number of sub-frames or sub-polynomials which can be calculated simultaneously. By overlapping the calculation of the sub-frames, the computer processor can concurrently calculate the remainders of a number of the sub-frames during the latent memory access operations. The remainders of the sub-frames are combined to form the remainder of the frame. The speed of calculating CRCs using a computer processor with latent memory access operations can thus be improved considerably.

BRIEF DESCRIPTION OF THE DRAWINGS

The foregoing and other objects, features and advantages of the present invention will be more readily appreciated upon reference to the following disclosure when considered in conjunction with the accompanying drawings, in which.

DETAILED DESCRIPTION OF THE PREFERRED EMBODIMENT

Figure 2:
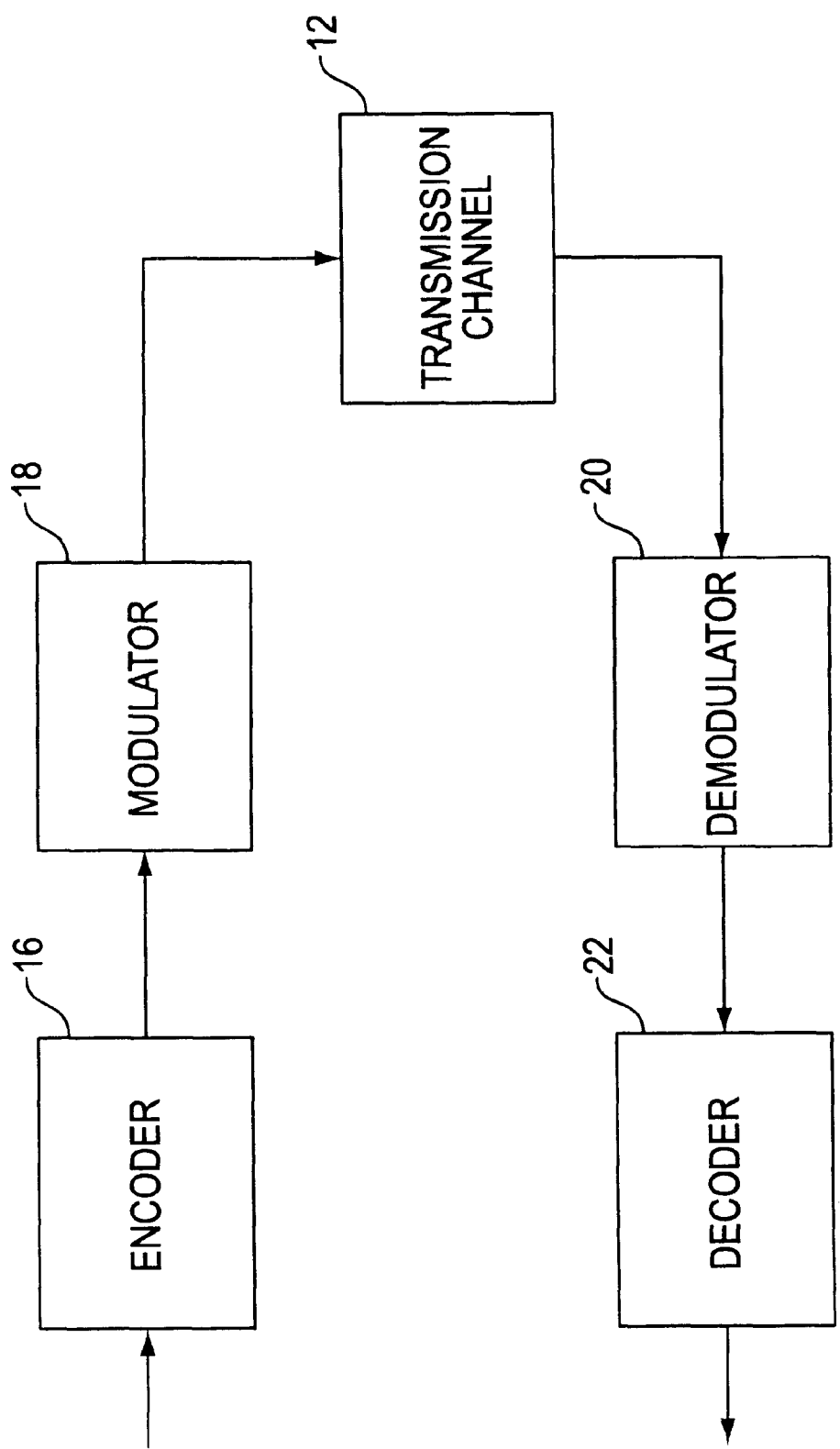
FIG. 2 shows an exemplary data transmission system for transmitting digital data in accordance with an aspect of the present invention.

FIG. 2 shows an exemplary data transmission system 10 for transmitting digital data in accordance with the present invention. The transmission channel 12 may not have a frequency bandwidth sufficient to directly convey digital information signals, so a modulator 18 modulates the digital data to a format that can be conveyed by the transmission channel 12. Various modulation techniques such as pulse amplitude modulation, frequency modulation, phase modulation, quadrature amplitude modulation may be utilized with the present embodiment.

The transmission channel 12 introduces a number of unwanted effects, such as attenuation, distortion, interference and noise to the data that corrupts the transmitted information. Because the channel 12 introduces errors corrupting the transmitted data, the data are encoded 16 to provide error detection and correction. The encoding may involve a number of stages and incorporate interleaving and other coding techniques known to those skilled in the art. The present invention focuses in particular on error coding techniques to combat the distortion and corruption of digital data caused by the transmission channel. It will be apparent to those of skill in the art that the techniques and devices described herein may be used in conjunction with other forms of encoding.

In the preferred embodiment, digital data are presented to the encoder 16 in frames consisting of a number of bits. Encoder 16 adds a number of bits to the digital data to create a more robust signal with error control and correction. Thus, the output of the encoder 16 contains more bits than the input, meaning redundancy has been added to the signal. The redundant bits added by the encoder 16 are determined by dividing the input bits, represented as a binary field polynomial, by a generator polynomial, as known to those skilled in the art. The demodulator 20 and decoder 22 perform complementary operations to the modulator 18 and encoder 16 to recover the originally transmitted digital data.

Figure 3:
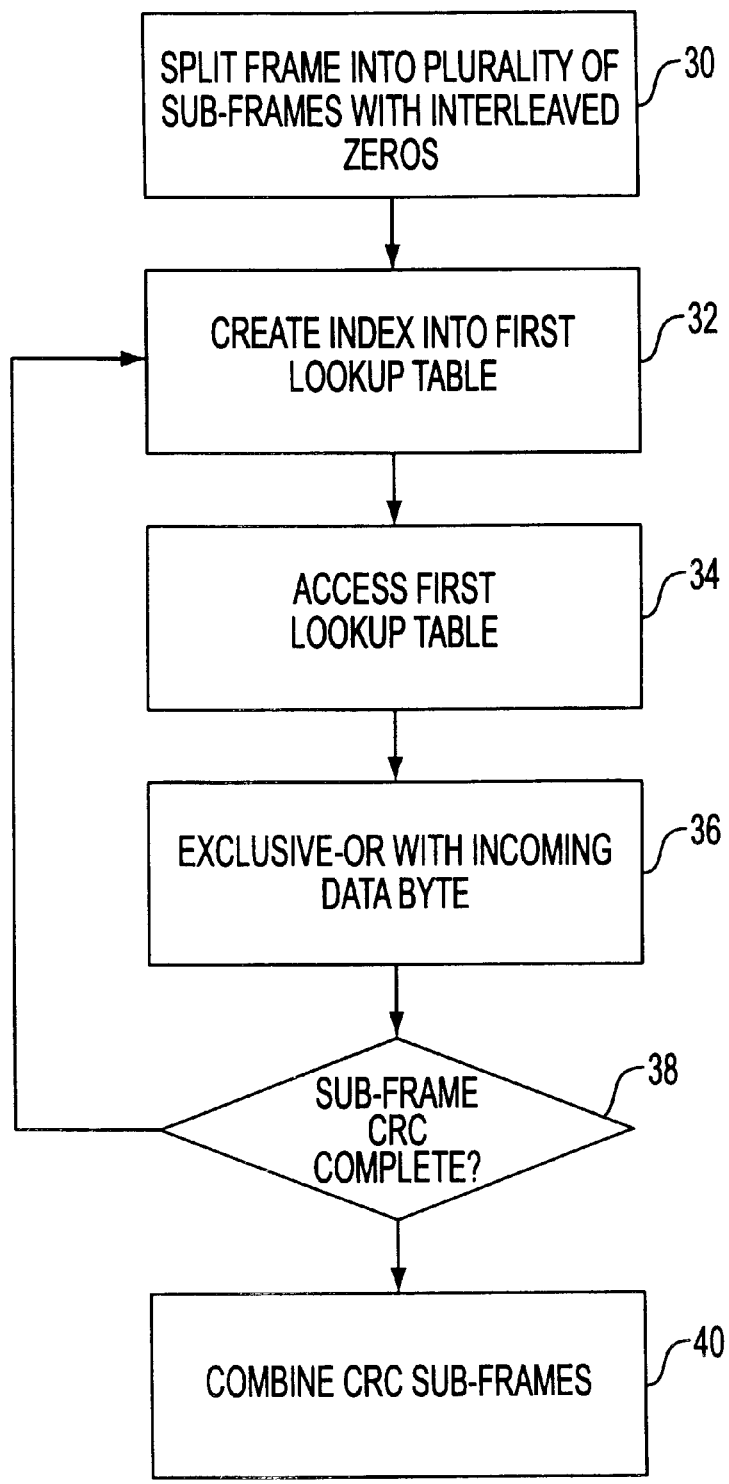
FIG. 3 shows a flow chart embodying an illustrative method in accordance with the principles of the invention used in the system of FIG. 2.

FIG. 3 shows a flow chart of an exemplary method used by the system of FIG. 2 to calculate cyclic redundancy checksums ("CRC") for detecting errors in transmitted data. The method is typically used with CRC generator polynomials that are known to those skilled in the art. For example, three well-known CRC generator polynomials are the following 12-bit CRC generator polynomial and two 16-bit CRC generator polynomials:

$g(X)=X^{12}+X^{11}+X^3+X^2+X+1$, $g(X)=X^{16}+X^{12}+X^5+1$ $g(X)=X^{16}+X^{11}+X^3+X^2+X+1$

At step 30, a frame of data D including a plurality of transmitted symbols $D=d_{n-1}, d_{n-2}, d_{n-2}, d_{n-2}, \ldots d_2, d_1, d_0$ is split or partitioned into a plurality of K sub-frames $D=D_0+D_1+D_2 \ldots +D_{K-1}$. For example, in this exemplary embodiment, the multi-symbol frame of data D is a 16 symbol frame:

$D=d_{15}, d_{14}, d_{13}, d_{12}, d_{11}, d_{10}, d_9, d_8, d_7, d_6, d_5, d_4, d_3, d_2, d_1, d_0$

The 16 symbol frame can be split into 4 sub-frames $D=D_0+D_1+D_2+D_3$ where:

$D_0=d_{15},0,0,0, d_{11},0,0,0, d_7,0,0,0, d_3,0,00,0$ $D_1=0, d_{14},0,0,0, d_{10},0,0,0, d_6,0,0,0, d_2,0,0$ $D_2=0,0, d_{13},0,0,0, d_9,0,0,0, d_5,0,0,0, d_1, 0$ $D_3=0,0,0, d_{12},0,0,0, d_8,0,0,0, d_4,0,0,0, d_0$

As seen above, each sub-frame is interleaved with a number of zero symbols, shown above as a K-1 number of interleaved zero symbols, such that each sub-frame is of the same length as the original frame. A number of zero symbols are also added to the beginning and end of the sub-frames to make the length of each sub-frame equal to N (N=16 in this case). Of course, it can be easily envisioned that the partitioning of the frame into K sub-frames can be increased to a greater number of zero-interleaved sub-frames. A greater K number of sub-frames require a greater number K-1 of interleaved zero coefficients. For example, 5 sub-frames with 4 interleaved zero coefficients, or 6 sub-frames with 5 interleaved zero coefficients, and so forth for up to K sub-frames with K-1 interleaved zero coefficients. The K number of sub-frames can be chosen according to the memory latency of the computer. Computer processors with greater memory latency will benefit from a greater degree of K partitioning. Splitting or partitioning of the sub-frames with the interleaved zero symbols can be implemented by simply manipulating the coefficients in computer registers, computer memory, or with dedicated electronic circuitry. Because the partitioning K is known a priori, the zero symbols needn't be actually stored in memory or registers, but the circuitry described below operates as if such interleaved zero symbols where actually present in the sub-frames.

Steps 32, 34, 36, and 38 calculate the remainder for a single sub-frame. These operations must be repeated for each sub-frame. One aspect of this invention is that the calculations of the remainder for each sub-frame can proceed concurrently. At step 32, the remainder of the sub-frame is updated by first creating an index for accessing a look-up table of recirculation values. The index is equal to the current remainder. In accordance with an aspect of the invention, the values in the look-up table correspond to the value of the shift registers after being shifted and XORed an amount equal to K* m bits, where K is the interleave factor and m is the number of bits in a symbol. The first (K-1)*m shifts account for the interleaved zeros symbols in the sub-frame, the last m shifts correspond to clocking the shift register for the m-bit symbol from the sub-frame corresponding to data originally in the frame. The number of interleaved zeroes varies according to the level of partitioning K of the frame. Thus, the look-up table will differ according to the level of partitioning K of the frame to account for the K-1 number of interleaved zero symbols. In this example, the look-up table will be referred to as CRCMODK[ ] where the value of K will differ with the degree of partitioning K. For example, for K=2, the appropriate look-up table will be referred to as CRCMOD2[ ] and is adapted to account one interleaved zero symbol between each original symbol. For K=4, the appropriate look-up table will be referred to as CRCMOD4[ ] and is adapted to account for 3 interleaved zero symbols. An exemplary method to generate the look-up table CRCMODK[ ] will be described below in more detail.

At step 34, the look-up table CRCMODK[ ] stored in memory is accessed using the index to return the appropriate value. Reading a value from the look-up table CRCMODK [ ] is equivalent to shifting K*m zero bits through the circuit of FIG. 1, with the $R_i$ values initialized to the index value.

At step 36, the next symbol from the incoming message frame is XORed with the recirculated remainder to complete the division iteration.

At step 38, the remainder calculation of the sub-frame iteratively repeats for each non-interleaved symbol (i.e. a symbol $d_i$ from original frame) of the sub-frame. For each non-interleaved symbol the first look-up table CRCMODK [ ] is accessed to return the result of the remainder recirculation taking into account the interleaved zero symbols. The remainder is then added using an exclusive-OR operation with the non- interleaved symbol from the sub-frame, to form a new remainder. Steps 32, 34 and 36 are iteratively repeated for each non- interleaved symbol of the sub-frame. In accordance with the present invention, the remainder calculation of a number of sub-frames can be carried out simultaneously. For example, the remainder calculation of a first sub-frame may become idle awaiting a latent memory access to the CRCMODK[ ] look-up table. During the memory latency, the remainder calculation of a second sub-frame may be initiated. The calculation of the second sub-frame may proceed until it initiates a latent memory access and must await results to be returned from memory.

If the first sub-frame calculation has completed its memory access, the remainder calculation of the first sub-frame can be resumed. If the first sub-frame has not completed its memory access, the remainder calculation of a third sub-frame can be initiated. Depending on the memory latency of the computer, an appropriate level of partitioning K of the sub-frame can be chosen to prevent the computer processor from being idle during memory accesses.

After the steps 32, 34 and 36 are completed for each sub-frame, the remainder for the sub-frames. $CRC(D_0)$, $CRC(D_1)$, $CRC(D_2)$, $CRC(D_3)$ ... $CRC(D_K)$ are updated.

Figure 4:
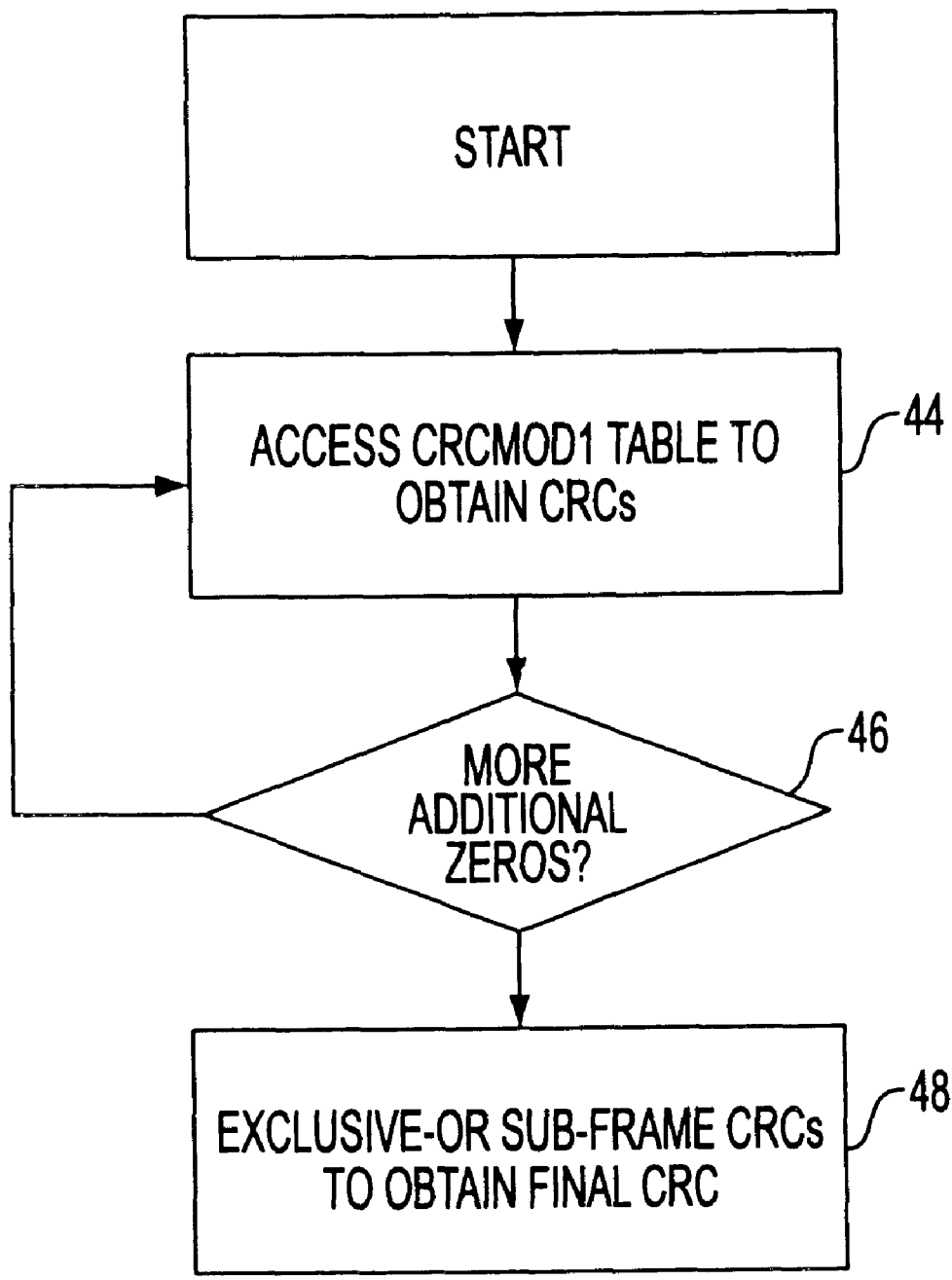
FIG. 4 shows a flow chart of a method of implementing block 40 of the method shown in FIG. 3.

At step 40 each of the calculated sub-frame $CRC(D_k)$s are combined to form the remainder of the frame of data. Now referring to FIG. 4, a description of the step of combining the sub-frame remainders at step 40 of FIG. 3 is provided in more detail. Generally, the remainders of the sub-frames can be combined using an exclusive-OR of the $CRC(D_k)$s of the individual sub-frames to form the remainder of the frame:

$CRC(D) = CRC(D_0) \oplus CRC(D_1) \oplus CRC(D_2) \oplus CRC(D_3)$

The calculation of the $CRC(D_k)$s of the individual sub-frames, however, do not include the extra zeroed symbols at the end of the sub-frames $D_0, D_1, D_2 \ldots, D_{K-2}$. Thus, the calculated $CRC(D_k)$s of those sub-frames must be modified to account for those additional zeros before being summed to form the final $CRC(D)$. Below are the formats for the sub-frames $D_k$ used to calculate the $CRC(D_k)$s in the sub-frame calculation.

$D_0 = d_{15}, 0, 0, 0, d_{11}, 0, 0, 0, d_7, 0, 0, 0, d_3, 0, 0, 0$
$D_1 = 0, d_{14}, 0, 0, 0, d_{10}, 0, 0, 0, d_6, 0, 0, 0, d_2, 0, 0$
$D_2 = 0, 0, d_{13}, 0, 0, 0, d_9, 0, 0, 0, d_5, 0, 0, 0, d_1, 0$
$D_3 = 0, 0, 0, d_{12}, 0, 0, 0, d_8, 0, 0, 0, d_4, 0, 0, 0, d_0$

At step 44, the calculated $CRC(D_k)$s of the sub-frames are compensated for the additional zero coefficients assumed at the end of each sub-frame $D_0, D_1, D_2$. To compensate for the appended zeroes, $CRC(D_0)$, $CRC(D_1)$ and $CRC(D_2)$ are modified using a single-step look-up table CRCMOD1 (rather than the K-step CRCMODK table used originally).

In the above example, for K=4, the following operations accessing the look-up table CRCMOD1 are necessary to compensate for the appended zeros:

$CRC_0$=CRCMOD1 (CRCMOD1 (CRCMOD1 (CRC$(D_0)$)))
$CRC_1$=CRCMOD1 (CRCMOD1(CRC$(D_1)$))
$CRC_2$=CRCMOD1 (CRC$(D_2)$)
$CRC_3$=CRC$(D_3)$

Accordingly, at step 46 the CRCMOD1 look-up operation is repeated the appropriate number of times, depending on the number of additional zeroes after the last original message symbol, for each sub-frame. It should be understood that in addition to the single step look-up table CRCMOD1, other methods of compensating for the number of additional zero symbols or eliminating the additional zero symbols altogether, can be implemented by those of skill in the art within the scope of the present embodiment.

At step 48, the remainders can be combined through an exclusive-OR of the modified remainders to form the result of the remainder calculation.

$CRC(D) = CRC_0 \oplus CRC_1 \oplus CRC_2 \oplus CRC_3$

Figure 5:
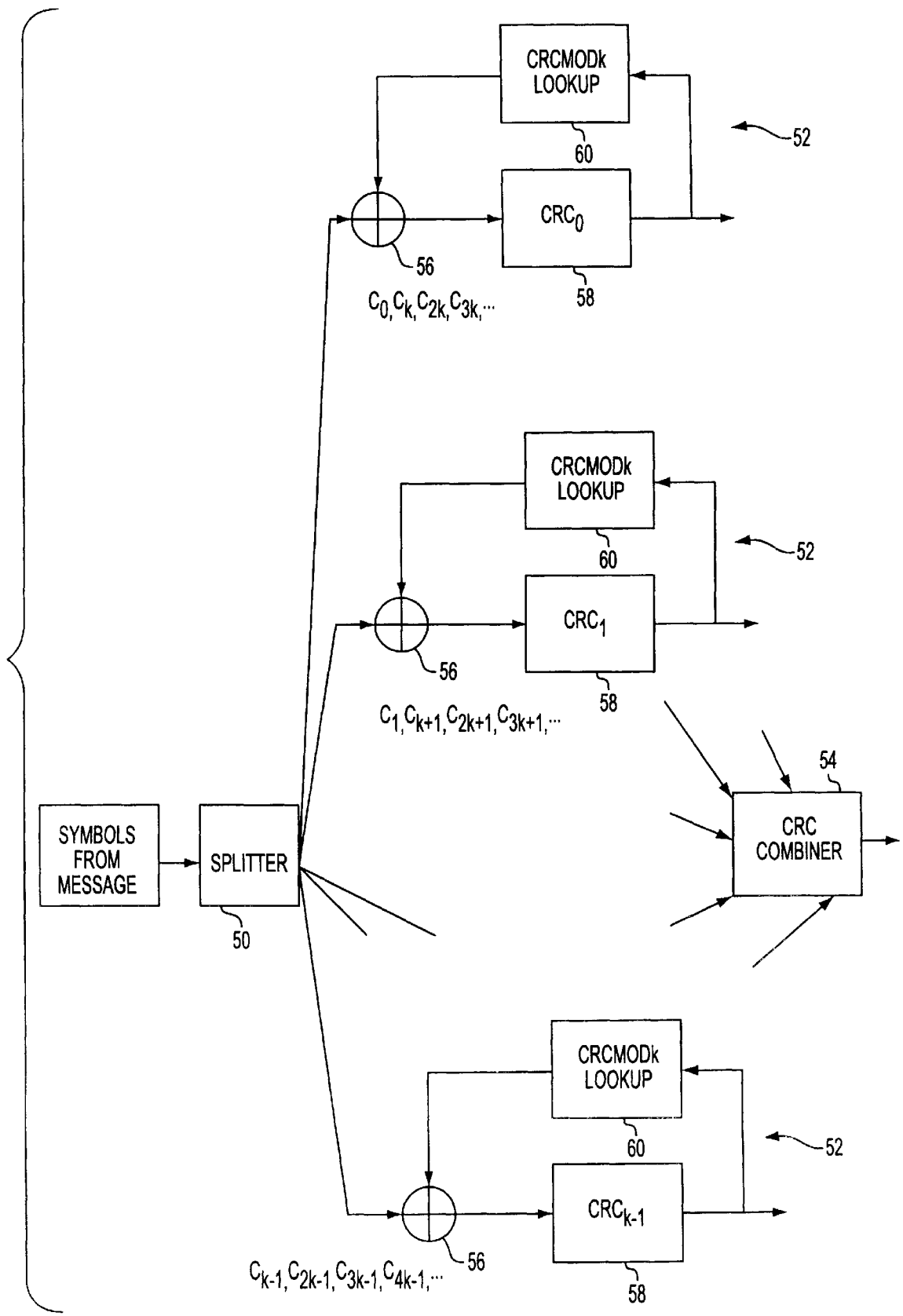
FIG. 5 shows a block diagram embodying an illustrative device in accordance with the present invention shown in FIG. 2.

Referring now to FIG. 5, illustrated is an exemplary device for implementing the remainder calculation in accordance with an aspect of the present invention. The exemplary device includes a splitter 50, a device for calculating the remainder of the sub-frames 52, and a remainder combiner 54. As depicted in FIG. 5, a plurality of devices for calculating the remainder of the sub-frames 52 are depicted to provide simultaneous, overlapping calculation of the remainder of the sub-frames. In addition, the operation of the device can be coordinated by control logic (not explicitly shown) implementing the remainder calculation methods described above. The control logic may be software, firmware or hardware programmed to implement the methods described in FIGS. 3 and 4.

To begin the remainder calculation, the splitter 50 splits the frame of symbols D=$d_{15}, d_{14}, d_{13}, d_{12}, d_{11}, d_{10}, d_9, d_8, d_7, d_6, d_5, d_4, d_3, d_2, d_1, d_0$ into a plurality of zero-interleaved sub-frames or sub-polynomials as previously described above. For example, the 16 symbol frame can be split into 4 sub-frames D=$D_0+D_1+D_2+D_3$ where:

$D_0 = d_{15}, 0, 0, 0, d_{11}, 0, 0, 0, d_7, 0, 0, 0, d_3, 0, 0, 0$
$D_0 = 0, d_{14}, 0, 0, 0, d_{10}, 0, 0, 0, d_6, 0, 0, 0, d_2, 0, 0$
$D_2 = 0, 0, d_{13}, 0, 0, 0, d_9, 0, 0, 0, d_5, 0, 0, 0, d_1, 0$
$D_3 = 0, 0, 0, d_{12}, 0, 0, 0, d_8, 0, 0, 0, d_4, 0, 0, 0, d_0$

As seen above, the splitter 50 splits each sub-frame and interleaves a number of zeroes such that each sub-frame is of the same length as the original frame. Of course, the frame can be partitioned into a greater number of sub-frames as previously described.

The splitter 50 can be implemented in computer software or with circuitry, combinatorial logic, shift registers, and buffers. For example, the polynomial coefficients $d_n$ can be stored in an array C[ ] and split into K sub-frames by having K indices indexing into the C[ ] array. A number of zero coefficients are added before each coefficient and a K−1 number of zero coefficients are interleaved in between each polynomial coefficient. The splitting of the frame or polynomial can be achieved with ordinary combinational logic and shift registers adding the appropriate zero coefficients interleaved among the polynomial coefficients. However, it should be noted that splitting the polynomial into sub-polynomials by adding appropriate zero coefficients as shown above is only for conceptual understanding and is not done explicitly. The function of the splitter is to separate the coefficients appropriately and provide a means of delivering those coefficients to the device for calculating remainders as shown in FIG. 5. A means of delivering the sub-polynomials to the device for calculating the remainders of the sub-frame 52 is not explicitly shown but could be implemented as an addressing unit in a computer processor.

The device for calculating the remainders of the sub-frames 52 includes adders 56, accumulators 58 and look-up table 60. A plurality of devices for calculating the remainders of the sub-frames 52 can operate in parallel to simultaneously calculate the remainders of a number of sub-frames. The adders 56 calculate remainder values using an exclusive-OR operation. The current remainder value is used to index the look-up table 60 and the result is added by the adder 56 to the coefficient $C_i$ of the zero-interleaved sub-frame supplied by the splitter 50. This generates the updated remainder value which is then used to index the look-up table 60 for the next iteration. The adders 56 can be implemented in software or hardware using circuitry, combinational logic, exclusive-OR logic gates, shift registers and buffers.

The accumulators 58 maintain the current remainder value during the remainder calculation of the sub-frames. More specifically, the accumulator 58 receives the recirculated remainder from the look-up table 60 and supplies it to the adder 56 to sum with the incoming symbol from the message. The result of the adder 60 forms the updated remainder. This updated remainder is then used to index the table CRCMODK for the next iteration of the symbol-wise polynomial division. The accumulator 58 maintains the current value of the remainder during each iteration of the remainder calculation of the sub-frame. The accumulator 58 may be embodied in computer software or by memory locations in random access memory, shift registers and buffers.

A look-up table 60 of pre-computed values, such as the CRCMODK look-up table, is provided to simulate recirculating the remainder through the division circuitry. A look-up table CRCMOD1 is generated to determine the division with the generator polynomial, accounting for the re-circulation of the non-zero coefficients of the CRC generator polynomial. The CRCMOD1 look-up table contains the result of circulating the remainder through the bit-wise polynomial division circuitry m times, where m is the number of bits in a symbol. The CRCMOD1 look-up table to account for dividing the current remainder by the generator polynomial of degree R can be generated by the following pseudo C code function:

```
for (TabIndex = 0; TabIndex < TableSize; TabIndex++)
{                                        /* For each table entry   */
    Crc = TabIndex << (R - m);
    for (Bitcount = m; Bitcount--;)      /* For each bit of        */
    {                                    the symbol
        Crc <<= 1;                       /* Shift CRC left         */
        If (Crc & 2^R)
            Crc x= GenPoly;              /* Exclusive-OR with      */
    }                                    Generator Poly
    CRCMOD1[TabIndex] = Crc;             /* Place entry in         */
                                         the table
}                                        /* Fill in the next       */
                                         table entry
```

Figure 1:
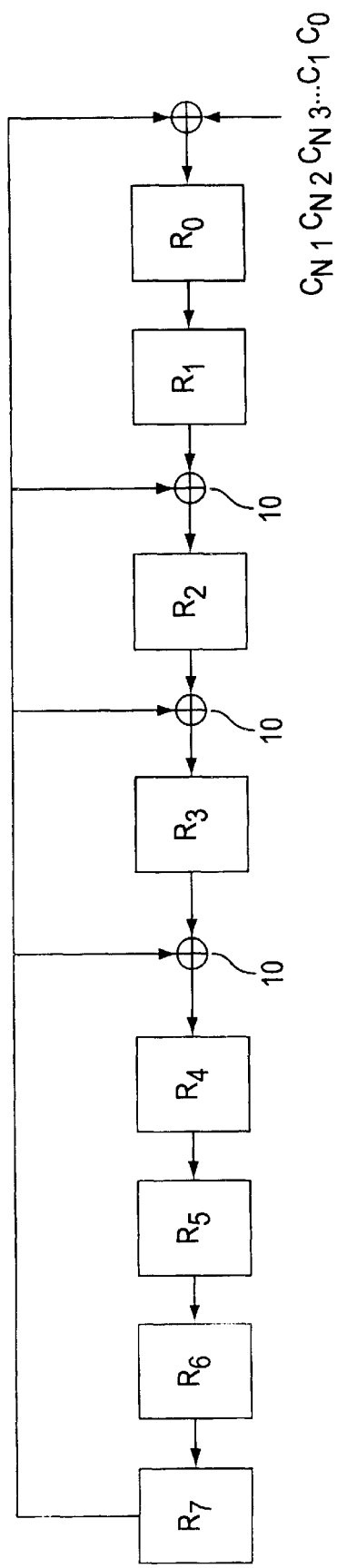
FIG. 1 shows a prior art logic circuit for calculating the CRC of a frame of data one bit at a time.
Figure 1A:
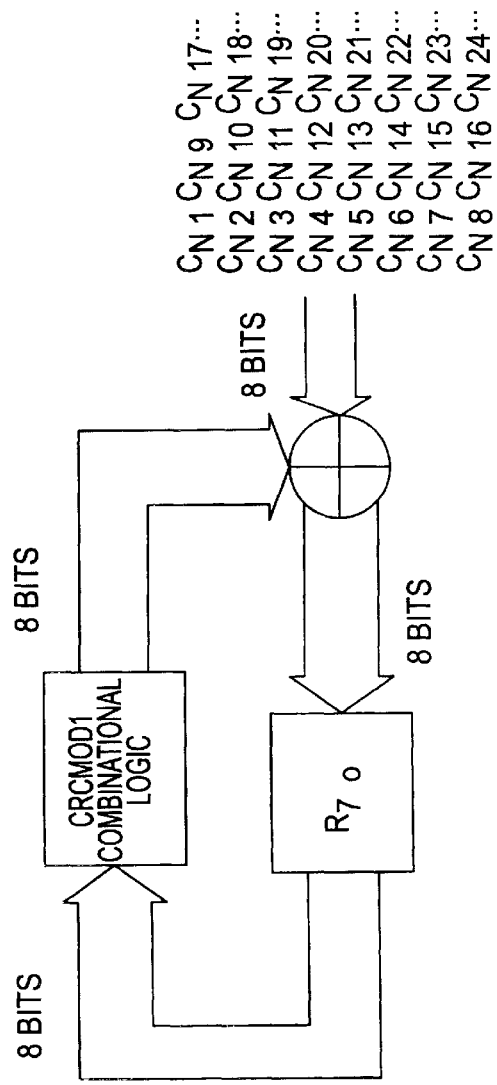
FIGS. 1a and 1b show prior art logic circuits for calculating the CRC of a frame of data one symbol at a time.
Figure 1B:
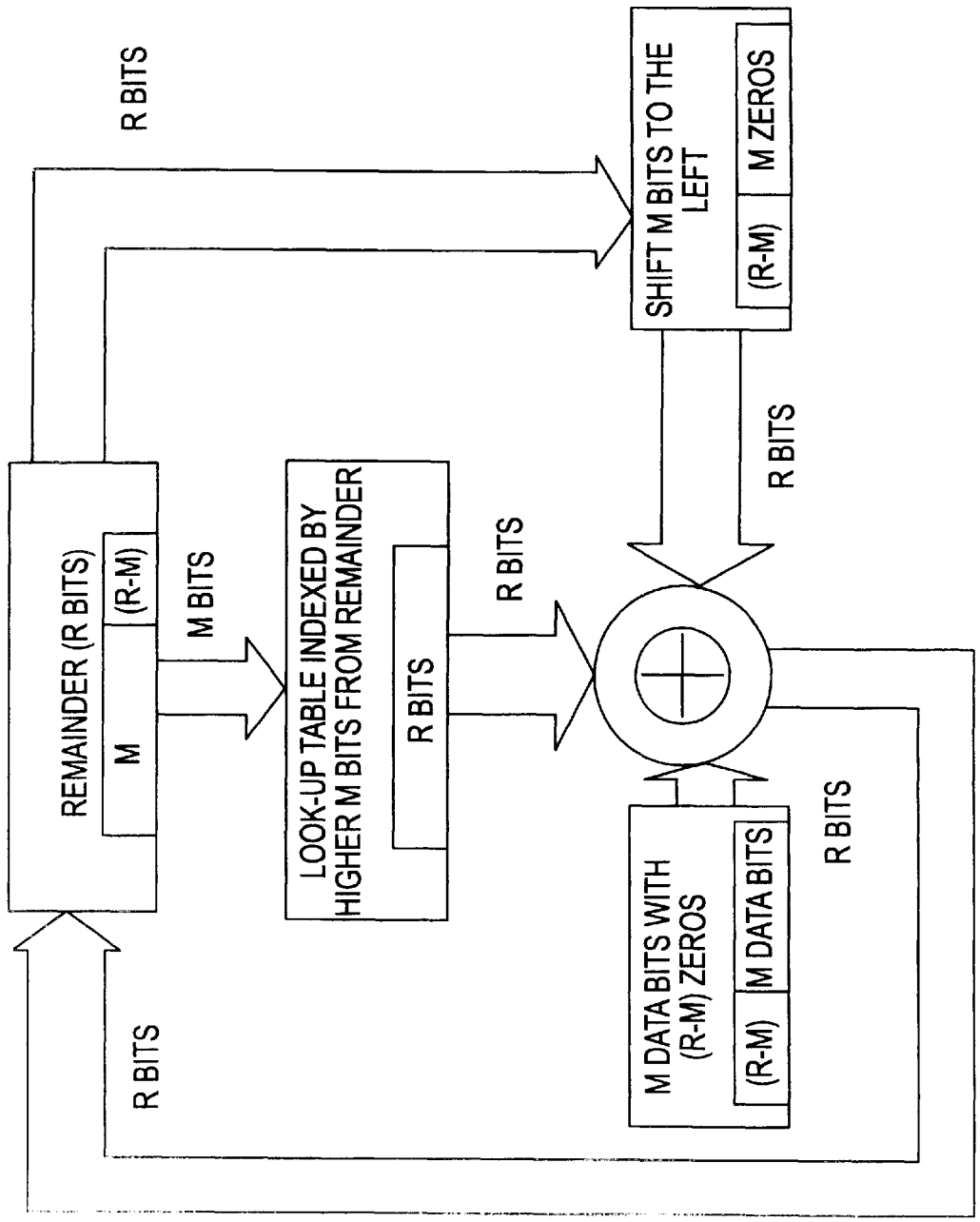

In the example of FIG. 1, the variable GenPoly would be equal to 0x11D, R would be equal to 8, m would be equal to 8, and TableSize would be equal to 256. The above code assumes that the MSB of each symbol is transmitted first.

The CRCMODK look-up table contains the result of circulating the remainder through the bit-wise polynomial division circuitry m*K times, where m is the number of bits in a symbol. The CRCMODK look-up table which accounts for K−1 interleaved zero symbols can be generated by the following pseudo C code function:

```
for (TabIndex = 0; TabIndex < TableSize; TabIndex++)
{                                        /* For each table entry   */
    Crc = TabIndex << (R - m);
    for (Bitcount = m*K; Bitcount--;)    /* For each bit of the    */
    {                                    symbol
        Crc <<= 1;                       /* Shift CRC left         */
        If (Crc & 2^R)
            Crc  = GenPoly;              /* Exclusive-OR with      */
    }                                    Generator Poly
    CRCMODK[TabIndex] = Crc;             /* Place entry in the     */
                                         table
                                         /* Fill in the next       */
}                                        table entry
```

Accordingly, the CRCMODK look-up table 60 is used to obtain the value of the remainder during the calculation of the sub-frames. By using the CRCMODK look-up table, only the non-interleaved symbols are explicitly used in calculations. The CRCMODK look-up table accounts for the interleaved zero-symbols, so operations using these zero-symbols needn't be performed. It should be understood that other methods to generate the look-up table can be implemented by those of skill in the art within the scope of the present embodiment.

The remainder combiner 54 combines the calculated remainders of the sub-frames to calculate the remainder of the frame of data. Generally, the remainders of the sub-frames are combined using an exclusive-OR operation to add the remainders of the sub-frames $CRC(D_k)$s to form the remainder of the frame as shown:

$$CRC(D)=CRC(D_0) \oplus CRC(D_1) \oplus CRC(D_2) \oplus CRC(D_3) \oplus \ldots CRC(D_{K-1})$$

The calculation of the remainders of the individual sub-frames, however, must account for the extra zero symbols at the end of the sub-frames $D_0, D_1, D_2, \ldots D_{K-2}$ as discussed earlier. In combining the remainders, a single step look-up table is used to compensate for the extra zeroes required at the end of each of the sub-frames $D_0, D_1, D_2, \ldots D_{K-2}$. For example, in the 16-symbol example discussed earlier, the affected $CRC(D_k)$s, (i.e. $CRC(D_0)$, $CRC(D_1)$ and $CRC(D_2)$) are modified to account for the added zeroes as follows:

$$CRC_0 = CRCMOD1 \ (CRCMOD1(CRCMOD1 \ (CRC \ (D_0)))$$
$$CRC_1 = CRCMOD1 \ (CRCMOD1 \ (CRC(D_1)))$$
$$CRC_2 = CRCMOD1 \ (CRC(D_2))$$
$$CRC_3 = CRC(D_3)$$

Accordingly, the CRCMOD1 operation is repeated the appropriate number of times for each sub-frame depending on the number of additional zero coefficients. It should be understood that other methods of generating a look-up table may be implemented by those skilled in the art within the scope of the present invention.

The CRC of the 16-symbol frame can then be formed by combining the modified remainders with an exclusive-OR operation:

$$CRC(D)=CRC_0 \oplus CRC_1 \oplus CRC_2 \oplus CRC_3$$

Figure 6:
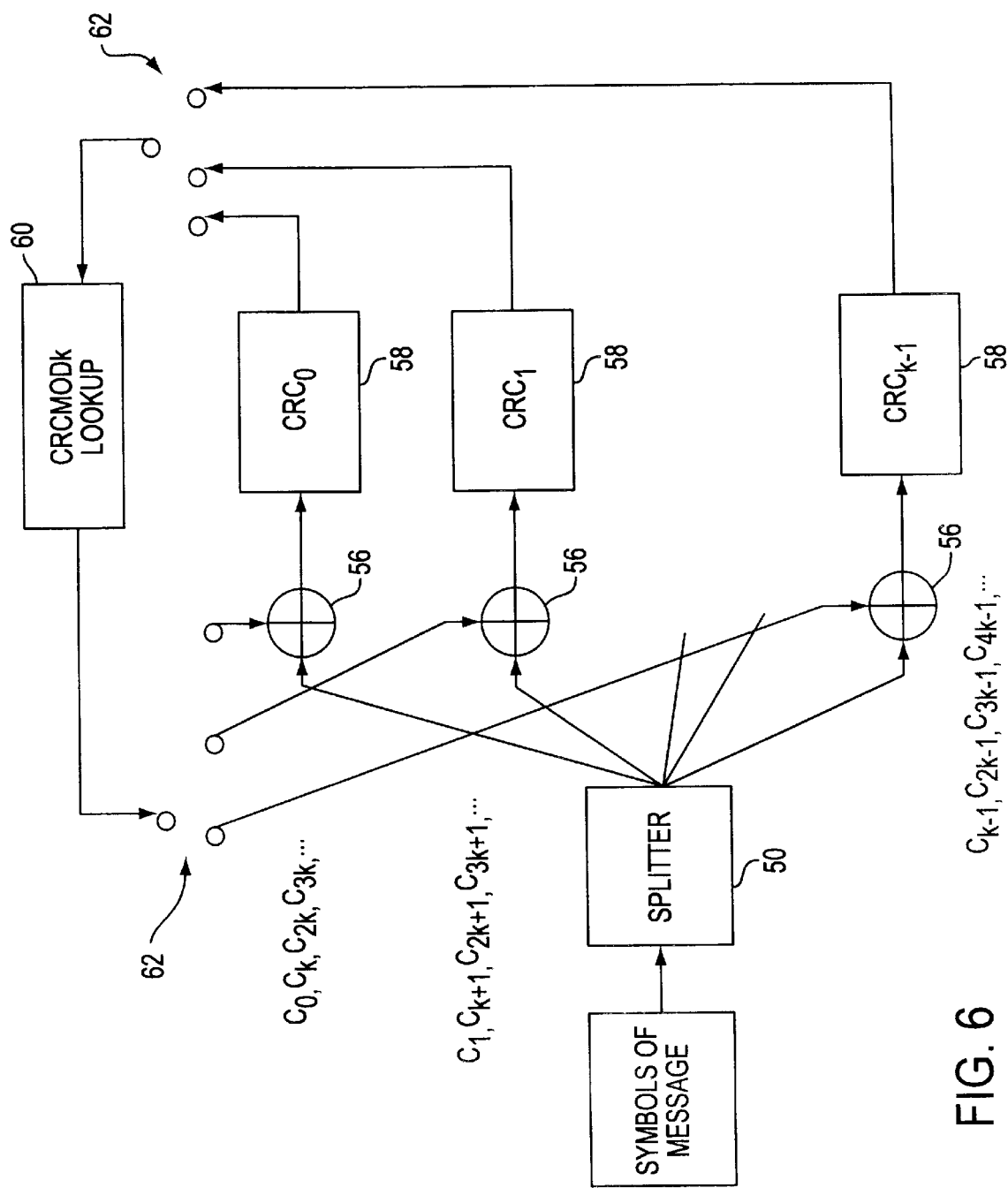
FIG. 6 shows another block diagram embodying an illustrative device in accordance with another aspect of the present invention.

Now referring to FIG. 6, an alternate embodiment of the invention is illustrated. The look-up table CRCMODK[ ] is an expensive resource that consumes a large amount of computer memory. To conserve memory, a common CRCMODK[ ] look-up table may be shared by a number of the sub-frame calculations. Access to the CRCMODK[ ] look-up table can be provided by commutating switch(s) 62. The plurality of adders 56 and accumulators 58 can thus share access to a common look-up table to conserve memory resources.

To coordinate the operation of the apparatus, control logic to control the addressing and sequencing of the addition and multiplication operations carrying out the simultaneous calculation of the sub-frames as described above may also be implemented using software, firmware, or hardware. Software implementing the operations described in connection with FIGS. 3 and 4 may be implemented by those skilled in the art with the aid of the Figures and descriptions herein. Likewise, digital hardware design using custom gate arrays or programmable logic arrays can be used to implement the desired functions.

The described methods and apparatus speed the calculation of remainders by splitting the frame of data into a plurality of sub-frames that can be calculated simultaneously. The calculation of the sub-frame can thus be performed such that the latency time to access the look-up tables is utilized to evaluate other sub-frames. In this fashion, a number of sub-frames can be simultaneously calculated and combined to more quickly obtain the remainder of the frame of data. In computer implementations where access to the look-up tables require multiple clock cycles to complete but can be initiated every clock cycle, the described embodiments can yield considerable improvements in speed.

It is to be understood that both the foregoing general description and the following detailed description are exemplary and explanatory and are intended to provide further explanation of the invention as claimed. Numerous modifications and variations are possible. It is intended that the foregoing detailed description be regarded as illustrative rather than limiting. It is the following claims, including all equivalents, which are intended to define the scope of this invention.

We claim:

1. A computer readable medium having stored therein instructions for causing a processing unit to execute a method of calculating a remainder of a binary polynomial representing a frame of bits comprising the steps of:

grouping coefficients of said binary polynomial into a sequence of m-bit symbols to form a shorter polynomial;

partitioning said shorter polynomial into a plurality of sub-polynomials of the same length as said shorter polynomial;

calculating the remainders of said sub-polynomials to form a plurality of remainders, wherein the calculations of at least two of the remainders are overlapped to be performed concurrently; and combining the calculated remainders of said sub-polynomials to form the remainder of the binary polynomial.

2. The computer readable medium of claim 1 wherein the step of calculating the remainders of the sub-polynomials comprises accessing a recirculation look-up table.

3. The computer readable medium of claim 1 wherein the step of combining the remainders of the sub-polynomials to form the remainder of the original polynomial comprises accessing a second look-up table.

4. The computer readable medium of claim 3 wherein the second look-up table comprises the remainder after m steps of binary polynomial division of $R(X)*X^m$ by a binary divisor polynomial, wherein $R(X)$ is the current remainder of the sub-polynomial and X represents a bit delay.

5. The computer readable medium of claim 1 wherein the step of partitioning the polynomial comprises adding a number of zero coefficients to the sub-polynomials to form a plurality of zero-interleaved sub-polynomials.

6. The computer readable medium of claim 1 wherein the step of combining the remainders of the sub-polynomials comprises modifying the plurality of remainders and adding said plurality of modified sub-polynomial remainders.

7. The computer readable medium of claim 6 where the step of adding comprises a symbol-wide bit-wise Exclusive-OR operation.

8. A computer readable medium having stored therein instructions for causing a processing unit to execute a method of calculating a remainder of a polynomial comprising the steps of:

partitioning the polynomial into a plurality of sub-polynomials of the same length as the polynomial, wherein a plurality of extra zero-coefficients are added to the sub-polynomials;

calculating the remainder of the sub-polynomials using a first look-up table, wherein the calculations of the remainders of at least two of the sub-polynomials are overlapped to be preformed simultaneously; and combining the sub-polynomial remainders to form the remainder of the original polynomial by modifying the calculated sub-polynomial remainders appropriately using a second look-up table to form a plurality of modified sub-polynomial remainders and adding the plurality of modified sub-polynomial remainders, wherein the second look-up table compensates for the extra zero-coefficients added to the sub-polynomials.

9. The computer readable medium of claim 8 wherein the second look-up table comprises a remainder recirculation look-up table, whose output is the remainder of m steps of a division of a binary polynomial $R(X)*X^m$, by a binary divisor polynomial, where m represents a number of bits in a symbol, $R(X)$ comprises a current remainder, and X represents a single bit delay.

10. The computer readable medium of claim 9 wherein the second look-up table compensates for end of frame effects from the step of partitioning the sub-polynomials.

11. The computer readable medium of claim 10 wherein the end of frame effects are caused by a number of additional zero coefficients of the sub-polynomials.

12. The computer readable medium of claim 8 wherein the first look-up table comprises a remainder recirculation look-up table, whose output is the remainder of m steps of a division of a binary polynomial $R(X)*X^{K*m}$, by a binary divisor polynomial, where m represents a number of bits in a symbol, K comprises an interleave factor, $R(X)$ comprises a current remainder, and X represents a single bit delay.

13. The computer readable medium of claim 8 where the step of calculating the remainders of zero-interleaved sub-polynomials further comprises:

accessing the data in the first look-up table stored in a computer memory by using a remainder value as the index into the table to return a look-up value; and, calculating a bitwise exclusive-OR of an input data symbol with the look-up value to update the remainder value.

14. The computer readable medium of claim 13 wherein the step of accessing the first look-up table comprises a latent memory access.

15. The computer readable medium of claim 13 wherein a plurality of accesses to the first look-up table are concurrently pending.

16. The computer readable medium of claim 13 wherein the simultaneously pending accesses share access to the first look-up table stored in a computer memory.

17. The computer readable medium of claim 8 wherein the step of partitioning is in accordance with latency of the memory accesses.

18. The computer readable medium of claim 8 wherein the step of combining further comprises the steps of:

accessing the second look-up table to form the plurality of modified remainders of sub-polynomials; and combining the plurality of modified remainder to form the desired remainder.

19. The computer readable medium of claim 18 wherein the step of accessing the second lookup table is performed a variable number of iterations for each of the calculated remainders of sub-polynomials.

20. The computer readable medium of claim 19 wherein the step of adding the plurality of modified sub-polynomials remainders comprises an exclusive-OR operation.

21. A device for calculating a remainder from a polynomial representing a frame of bits in a data transmission system using a generator polynomial and first and second look-up tables stored in computer memory comprising:

a splitter for partitioning the polynomial into a plurality of zero-interleaved sub-polynomials of the same length as the polynomial;

a plurality of adders in communication with the splitter, to compute the remainders for the plurality of zero-interleaved sub-polynomials;

a first look-up table which accounts for the interleaved zeros in the plurality of sub-polynomials while computing their remainders;

a plurality of accumulators for storing the calculated remainders of the plurality of sub-polynomials; and a combining means for combining the calculated remainders of the plurality of sub-polynomials to form the final remainder.

22. The device of claim 21 further comprising a second look-up table.

23. The device of claim 21 further comprising a commutating switch to select the first look-up table.

24. The device of claim 21 wherein the adders comprise an exclusive-OR device.

* * * * *